United States Patent [19]

Tirkel

[11] Patent Number: 4,891,605

[45] Date of Patent: Jan. 2, 1990

[54] ADAPTIVE GAIN CONTROL AMPLIFIER

[76] Inventor: Anatol Z. Tirkel, 21 Walstab Street, East Brighton, 3187 Victoria, Australia

[21] Appl. No.: 198,997

[22] PCT Filed: Aug. 12, 1987

[86] PCT No.: PCT/AU87/00259

§ 371 Date: Apr. 11, 1988

§ 102(e) Date: Apr. 11, 1988

[87] PCT Pub. No.: WO88/01453

PCT Pub. Date: Feb. 25, 1988

[30] Foreign Application Priority Data

Aug. 13, 1986 [AU] Australia .............................. PH7468

[51] Int. Cl.$^4$ ............................................. H03G 3/32
[52] U.S. Cl. .................... 330/279; 330/149; 330/129; 381/94
[58] Field of Search ............... 330/129, 149, 279, 134; 381/71, 57, 94, 95, 107, 108; 455/238; 379/347

[56] References Cited

U.S. PATENT DOCUMENTS

| 3,814,856 | 4/1974 | Dugan ................................ 381/57 |
| 3,934,084 | 1/1976 | Munson et al. ................... 179/1 VL |
| 4,079,335 | 3/1978 | Doerig ................................ 330/281 |
| 4,322,579 | 3/1982 | Kleis et al. ......................... 179/1 D |
| 4,644,292 | 2/1987 | Kunugh et al. ................. 330/149 X |
| 4,677,389 | 6/1987 | Op De Beek et al. .............. 330/129 |

FOREIGN PATENT DOCUMENTS

| 0026929 | 4/1981 | France . |
| 99811 | 6/1982 | Japan ................................... 330/134 |
| 2179809 | 3/1987 | United Kingdom . |

OTHER PUBLICATIONS

"Automatic Control of Speaker Output Compensates for Noisy Background", Electronics, Nov. 1972 edition, pp. 118 to 121.

Primary Examiner—James B. Mullins
Attorney, Agent, or Firm—Stevens, Davis, Miller & Mosher

[57] ABSTRACT

An adaptive gain control amplifier (12) is described in relation to an audio system for adjusting output volume of a loudspeaker (16) automatically in response to an interference signal (21) such as background noise. The amplifier (12) includes a divider circuit (30) which computes the ratio of a time average of a corrupted signal (20, 21) which is a combination of a controlled output signal (20) and the interference (21), to produce a control voltage which controls the gain of the amplifier. To reduce the dynamic range of the quotient of the ratio the divider circuit (30) incorporates a logarithmic ratio circuit. The circuitry of the amplifier includes a "sensing channel" and a "reference channel" for extraction of the above averages of the corrupted signal and controlled output signal, respectively.

6 Claims, 5 Drawing Sheets

ADAPTIVE GAIN CONTROL AMPLIFIER

This invention relates to adaptive gain control amplifiers for automatic enhancement of desired signals delivered to a receiver or receivers which are susceptible to external interference of a kind which may corrupt the received signal. More specifically the invention relates to an adaptive gain control amplifier and to a method of adaptive gain control which has particular utility in audio systems such as public address systems, telephones, automotive and domestic hi-fi and the like where there is a need to adjust the output volume of a loudspeaker automatically in response to variations in background noise. It will however, become readily apparent to those skilled in the art that there are many other applications of the invention such as for example in adaptive radio transmitter control and automatic contrast control in illumination.

Most known electronic circuits for signal enhancement are designed to minimize the signal degradation at the source, during electronic processing or during storage or playback (for example, "Dolby" (Registered Trade Mark) or "DNR" (Registered Trade Mark)). However, these techniques are not capable of signal enhancement directly at the receiver as is the case with this invention. Thus, the action of the adaptive gain control amplifier is complementary to that offered by the abovementioned circuits.

Most of the circuits designed specifically for acoustical systems such as public address, intercoms, telephones, automotive and domestic audio, where the desired signal enhancement is required to occur at the ear of the listener are based on two techniques. The first technique requires the corrupted signal to be decomposed into its desired and interference componets. Simpler systems use apriori separation based on assumed or empirically determined spectral (or temporal) characteristics of the signal or interference. Examples of this technique are found in automotive audio modules such as Hitachi ASLC (Automatic Sound Level Control) and Alpine 3015 (Preamplifier, 7 Band Computer Graphic Equalizer). These are specifically designed for automotive audio use and rely on measured road noise spectral characteristics, which renders them restrictive, arbitrary and generally low performance. Ideally, dynamic or adaptive decomposition of the corrupted signal into its desired and interference components would improve the performance of these systems. However, in most cases this decomposition or analytical separation is very complex and costly to implement.

This is because in acoustical applications sufficiently precise separation of the corrupted signal into its desired and interference components is rendered complicated or impossible because of diffraction and multipath effects which preclude simple spatial separation as well as temporal and spatial distortions induced by transducer and medium non-linearities, time delays, reverberations, and other reflection, refraction and absorption phenomena resulting from material properties and discontinuities thereof. Imperfect separation renders some known enhancement system susceptible to instabilities (such as howling in public address systems) or reduces their effectiveness. Some known systems (for example Alpine) avert the first consequence by imposing severe restrictions on gain control thereby reducing it, for example, to a single discrete step adjustment. Another technique (noise cancellation), uses a controlled filter to subtract out the said interference, employing a least mean square algorithm to derive the control signal. This technique is normally used for signal enhancement at the source, but can be adapted for use on receivers. The amount of signal enhancement obtainable by this method is the highest known at this time. However, this perceived enhancement varies drastically depending on the listener's location, and can even result in actual degradation at some locations. In addition, the implementation of the algorithm and filter is expensive and the system is rather slow and requires a "learning period".

Accordingly, it is an object of this invention to provide an improved automatic signal enhancement processor which avoids or at least reduces one or more of the aforementioned disadvantavges of known apparatus.

The invention therefore provides an adaptive gain control amplifier comprising a sensing channel having a sensor for detecting a corrupted output signal, and a processor for processing said corrupted signal to produce a control voltage for controlling said amplifier to alter the gain thereof whereby a desired input signal is converted to a controlled output signal, characterized in that, said processor includes a divider circuit which computes the ratio of a time average of said corrupted signal and said controlled output signal to produce said control voltage.

In a further form the invention provides a method of processing a desired signal to produce a controlled output signal for situations where said output signal is combined with an interference signal thus producing a corrupted signal at a receiver, said method involving the step of sensing and processing said corrupted signal to produce a control signal for controlling processing of said desired signal to compensate for said interference signal, characterized in that, said processing of said corrupted signal includes computing the ratio of a time average of said corrupted signal and a prescaled version of the said controlled output signal to produce said control signal.

In order that the invention may be more readily understood, a particular embodiment will now be described with reference to the accompanying drawings wherein.

Figure 1:
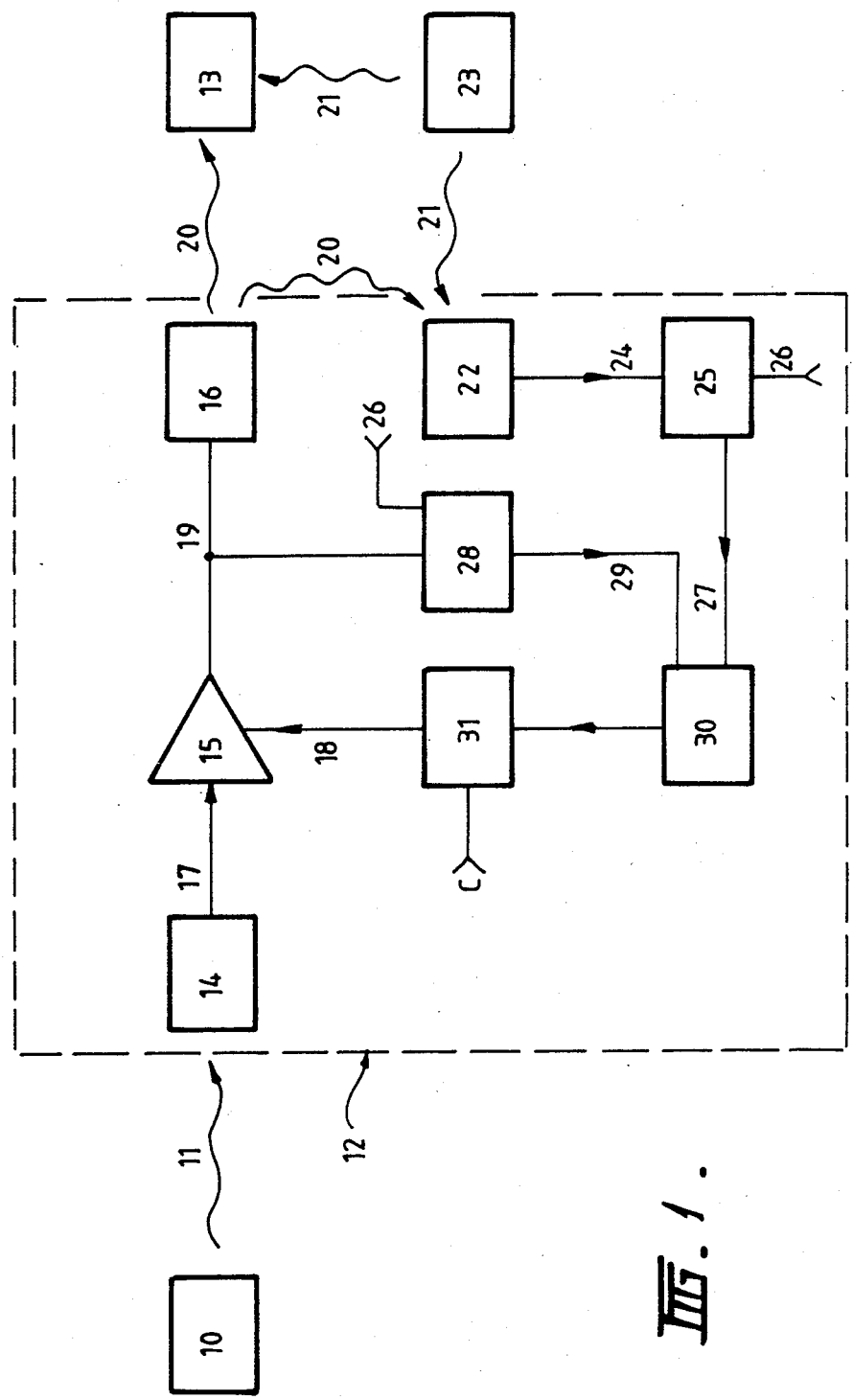
FIG. 1 is a basic schematic block diagram depicting an automatic signal enhancement processor according to the invention.

In FIG. 1 a transmitter 10 transmits a signal 11 which, in this embodiment, is an audio signal but in another embodiment could be a radio frequency or light signal for example. The signal processor of the embodiment is shown within the broken lines 12 and is located between the transmitted signal 11 and an intended receiver 13. In this case the receiver 13 is the ear of a listener. The embodiment could be that of a Public Address System, for example. Some components of the signal processor 12 may be present in a conventional audio system to provide amplification. An input transducer 14, gain control amplifier 15 and output transducer 16 would normally provide conversion and amplification of the audio signal which, upon leaving the output transducer 16 travels the airwaves to the receiver 13. In other words, the input transducer 14 intercepts the desired signal 11 and converts it into electrical form on connection 17. The resultant electrical signal on 17 is multiplied, in amplifier 15, by a control voltage on 18 whereby the enhancement is affected. The enhanced output of amplifier 15 on connection 19 is converted into its final, usable form, by the output transducer 16 to produce the audio signal 20 which is heard by the listener.

The derivation of the control voltage 18 is based on the computation of the quotient between relevant statistical averages relating to the corrupted and desired signals respectively. Henceforth, the circuits involved in the extraction of the above averages are referred to as the "sensing channel" which relates to the sensing of the corrupted signal, and the "reference channel", which relates to the desired signal.

The corrupted signal, which is a combination of the audio signal 20 and interference signal 21 is sensed and transformed into its electrical equivalent by sensor transducer 22. The interference signal 21 emanates from a source or sources referenced by 23. The electrical equivalent of the corrupted signal appears on connection 24 to functional converter and time averager 25. The objective here is to ensure that the corrupted signal intercepted by sensor transducer 22 is representative of the signal incident upon the receiver 13. The signal on 24 is converted by functional converter and time averager 25 into a functional form appropriate to conform with the sensitivity function of the receiver 13. This is then time averaged in accordance with the requisite signal statistics over the gating interval determined by a clock signal on connection 26. Thus the output on connection 27 from the device 25 represents the required measure of the corrupted signal over the duration of the averaging or gating period t as controlled by the clock on connection 26.

A similar process is performed by another functional converter and time averager 28 within the reference channel, wherein the enhanced (desired) electrical signal is subjected to a similar transformation and averaging. The output of 28 is provided on connection 29 which together with connection 27 is applied to the divider 30 which computes the ratio between the two transformed and averaged signals. This resultant quotient is conditioned by interface circuit 31 in order to render it suitable for application as the control voltage on connection 18. Signals appearing on 19 and 24 may be prescaled (by slaved gain controlled amplifiers identical to 33) prior to their application to 28 and 25 respectively. This allows for different types of enhancement to be affected resulting in different governing equations and asymptotic and transient behaviour.

The control loop is recursive, with updates in the control voltage on 18 occurring one computation cycle (approximately $\Delta t$) after the sensing. In order to ensure loop stability, the correction should be a monotonic function of signal degradation. It should be noted that the signal enhancement processor 12 offers quantized or continuously variable adjustments of the control voltage on 18. More detailed explanations of the internal operation of the processor will become apparent by way of description relating to the more detailed circuitry of FIGS. 2 and 3.

Figure 2:
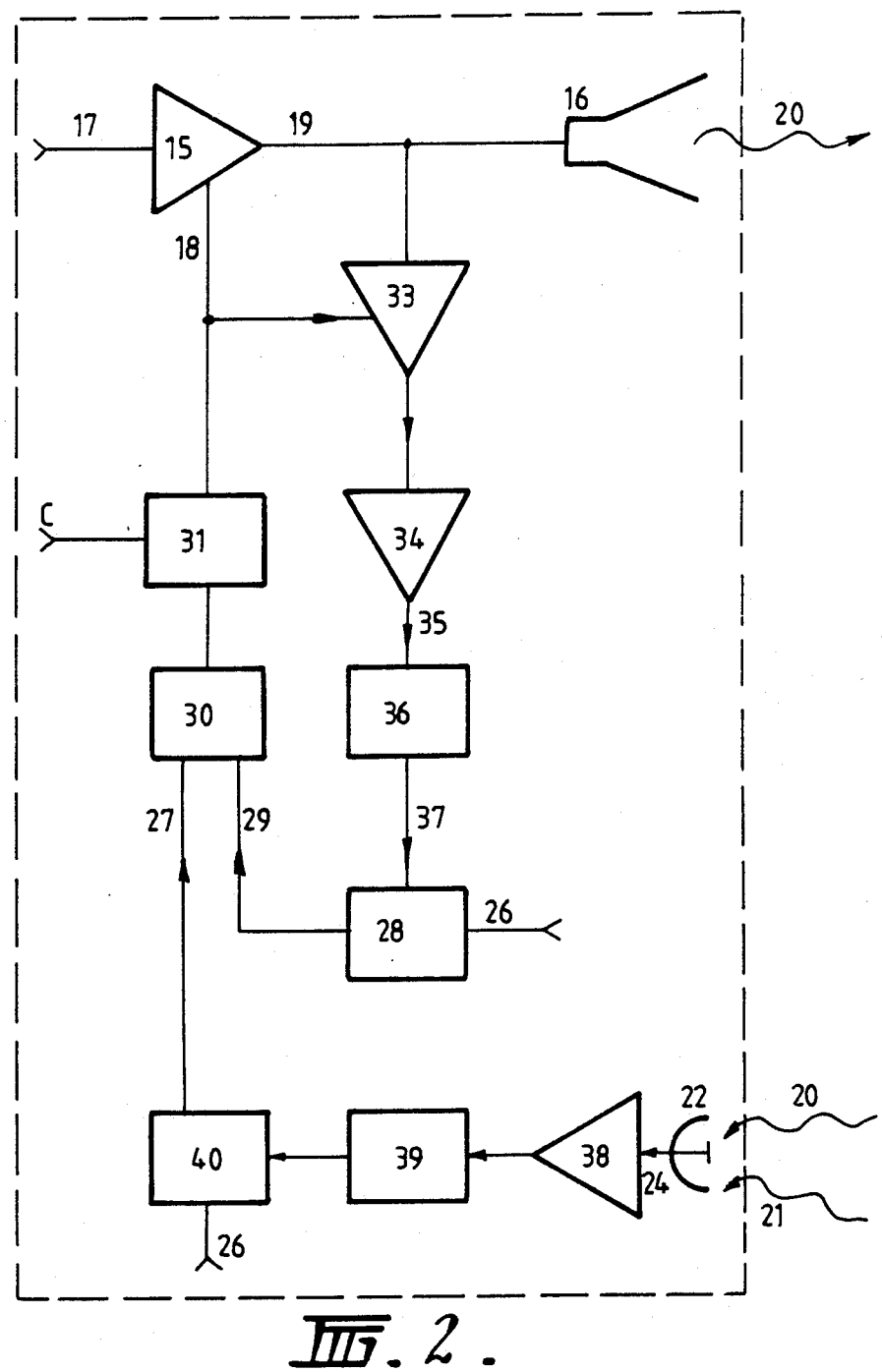
FIG. 2 is a more specific schematic block diagram of the invention disclosed in FIG. 1 and directed specifically to an acoustic application thereof.

Referring now to FIG. 2 which shows an acoustical application in more detail, it will be noted that features of the diagram common with or similar to those of FIG. 1 are referenced by corresponding reference numerals. In most audio applications, the desired signal is already in its electrical form and hence available for enhancement by the gain control amplifier 15. The gain control amplifier 15 may take various forms depending on cost, distortion, isolation between signals on input connection 17 and output connection 19 and control voltage on 18, and dynamic enhancement range. FIGS. 3($a$), ($b$), and ($c$) illustrate examples of gain control amplifier 15 circuits designed specifically for (a) low cost,
(b) high fidelity and
(c) simplicity.

The enhanced signal on 19 is usually amplified by a power amplifier (not shown), and transformed into its acoustical form 20 by loud speaker 16 (output transducer of FIG. 1). The dynamic range of most audio systems is in excess of 50 dB and since the control loop relies on ratiometric computation, the dynamic range of the quotient can exceed 100 dB. Therefore, some compression is advantageous within the computation chain. This compression can be achieved through the the use of a logarithmic ratio circuit 30, as will be described in detail hereinbelow. In order to ensure stability, and acceptable transient and asymptotic behaviour, an additional gain control amplifier in the form of a prescaler 33 of gain $G^m$ is provided in the reference channel (control voltage is shared with the control voltage of the main gain control amplifier 15, and individual amplifier characteristics are assumed to be well matched). The governing equation for voltage adjustments $\Delta V$, in the control voltage (18) immediately following the $n^{th}$ gating interval is:

$$\Delta V = \log\left(\frac{G_{n+1}}{G_n}\right) = \epsilon \log \overline{\frac{G_n S_n \oplus N_n}{G_n^{m+1} \cdot S_n}}$$

where
  $n$ refers to $n^{th}$ gating time interval
  $n+1$ refers to $N+1^{th}$ gating ime interval
  $S_n$ is input signal (17)
  $N_n$ is sensed interference component (21)
  $\epsilon$ is gain factor of logarithmic ratio circuit (30) and subsequent amplifier (31).
  $m$ is the number of prescalers in reference channel (negative if prescalers are in sensing channel).
  (proportionality coefficients of all transducers are assumed to be 1 for simplicity).

If the noise is not correlated with the signal over the gating period $$\Delta V = \frac{\epsilon}{2} \log \frac{G_n^2 \overline{S_n^2} + \overline{N_n^2}}{G_n^{2m+2} \cdot S_n^2}$$

Static Asymptotic Solution is one for which $\Delta V = 0$, Hence $G_n = G_\infty$ $$G_\infty^{2m+2}\overline{S_\infty^2} - G_\infty^2\overline{S_\infty^2} - \overline{N_\infty^2} = 0$$

It can be shown that for m=1

$$G_\infty = \sqrt{\frac{1}{2}\left[1 + \sqrt{1 + \frac{4N^2}{S^2}}\right]}$$

which has desirable properties (prescaler gain=$G_n$), for example, for high S/N ratios $G_\infty \to 1$
For high N/S ratios $$G_\infty \to \sqrt[4]{\frac{N^2}{S^2}}$$

This functional implementation has been studied for its transient behaviour, and it has been established that for $\epsilon < 0.65$ there is no overshoot. ($\epsilon$ has similar properties to a damping coefficient).

As a compromise between rapid convergence and undesirable ringing, $\epsilon = 0.6$ was chosen as a practical value. If required, upper and lower limits can be applied to $\Delta V$ by a limiter (not shown) and a deadband circuit (not shown) respectively. Practical values chosen are 15 dB and 1.5 dB respectively.

In addition to the prescaler 33 the reference channel processing consists of a gain stage and filter 34, used to scale the magnitude of the desired output signal on connection 35 and limit its bandwidth to a relevant frequency range, for example, to match the response characteristics of the receiver 13 in FIG. 1. This is followed by a precision rectifier, or absolute value circuit 36 which removes the polarity dependence of the signal, a requirement imposed by the characteristics of the sensing microphone 22 (sensor transducer in FIG. 1) and the human ear. The output on 37 from circuit 36 is time averaged by the integrator 28 over the gating interval $\Delta t$ as controlled by the clock signal on 26, resulting in a mean average deviation (MAD). Alternative functional implementations can involve the RMS or simply the mean square MS.

The averaging period $\Delta t$ is chosen to be approximately 200 mS. This reflects a compromise between the accuracy of averaging and the desired speed of response. The former is influenced by reverberation and other environmentally induced effects. Appropriate choice of the latter is required. This is because excessively rapid response updates are likely to result in objectionable incidental modulation distortion, whilst unduly slow response can result in unacceptably long correction delays and consequent lack of transient suppression. Gradual application of the correction is a potential solution, but this requires proper weighting of the statistical average to compensate for the time dependence of the gain during averaging.

The sensing channel in FIG. 2 consists of a sensing microphone 22 (sensing transducer in FIG. 1), followed by a gain stage and filter 38, precision rectifier/filter 39 and gated integrator 40, whose functions are similar to their equivalent counterparts in the reference channel comprising components 34, 36 and 28, respectively, with slight parameter variations to compensate for the microphone characteristics and the required frequency response of the channel. The outputs on connections 27 and 29 from 40 and 28 respectively, thus represent the MAD values for the preceding interval $\Delta t$ relating to the reference channel and the sensing channel respectively.

These outputs are subsequently applied to the precision logarithmic ratio circuit 30 corresponding to the divider 30 of FIG. 1. The logarithmic characteristic described above, is implemented herein to increase the operational dynamic range and to optimize the matching to the amplitude response function of the typical human ear. The output of 30 is processed by conditioning circuit 31, the purpose of which is to sample the output of 30 and maintain it for the duration of the gain adjustment period determined by a clock on connection C. If required, conditioning of this held output should be performed in order to match the response characteristics of the control input on 18 to 15 and 33. This may include scaling and offset adjustments, limit setting (for minimum and maximum corrections, functional transformation, for example, log-linear, impedance matching, deglitching, attack time control, etc. Some of this matching controls the dynamic approach to equilibrium or tracking by acting as damping.

Figure 3A:
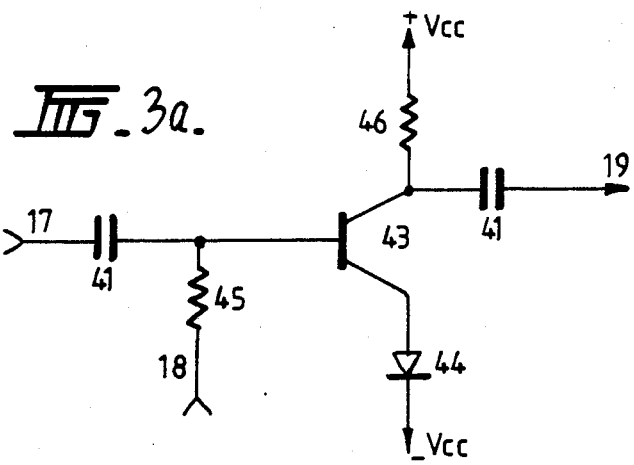
FIGS. 3(a), 3(b) and 3(c) show alternatives, in detailed circuit format, of a gain control amplifier of FIGS. 1 and 2.
Figure 3B:
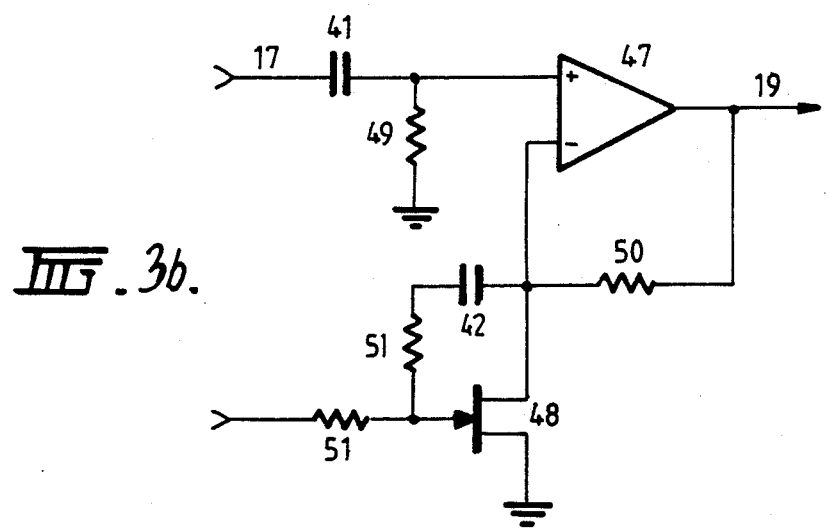

FIGS. 3(a), (b) and (c) show various forms of the gain control amplifier 15 in more detail. In each diagram the capacitors 41 and 1 $\mu$F and the capacititor 42 in FIG. 3(b) is a 0.01 $\mu$F capacitor. The circuitry of FIG. 3(a) utilizes a transistor 43 which is a 2N3904 and a diode 44 which is an IN914. Resistor 45 is a 470K$\Omega$ resistor and resistor 46 is a 22K$\Omega$ resistor. The circuitry of FIG. 3(b) utilizes an operational amplifier 47 which is an LM318 and a FET 48 which is a PN4391. The resistor 49 is 10K$\Omega$, resistor 50 is 20K$\Omega$ and the two resistors 51 are 1M$\Omega$.

Figure 3C:
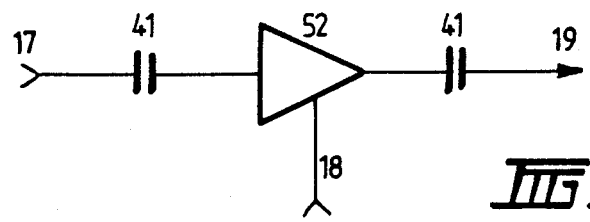

The circuitry of FIG. 3(c) is a much simplified circuit which incorporates intergrated circuit package 52 which is an MC3340, which uses a Gilbert type transconductance multiplier.

Figure 4:
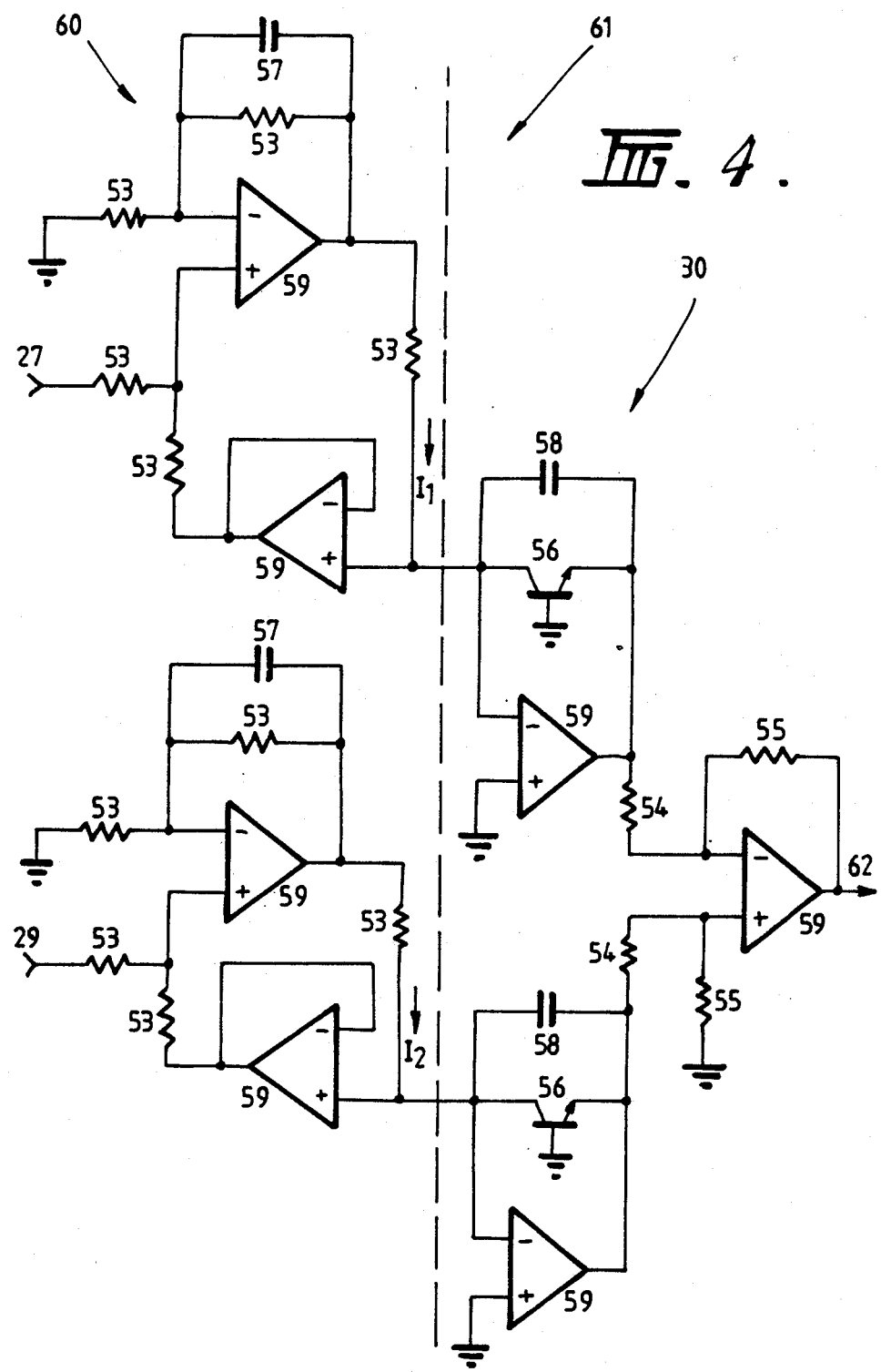
FIG. 4 is a detailed circuit diagram of a logarithimic divider of FIGS. 1 and 2.

Reference should now be made to FIG. 4 which shows a more detailed circuit diagram of the logarithmic ratio circuit 30. Inputs to the circuit 30 of FIG. 4 appear on connections 27 and 29 which correspond to the connections shown in FIG. 2. The circuit is divided into two parts 60 and 61 respectively, which are separated by the broken line shown in the drawing. The first part 60 is a voltage to current conversion part and the second part 61 is the logarithmic circuit. The output appears on connection 62. In the circuit 30 the resistors 53 are 10K$\Omega$ resistors, resistors 54 are 1K$\Omega$ resistors and resistors 55 are 12K$\Omega$ resistors (all resistors have a 1% tolerance). The transistors 56 are matched transistors of type LM394. The integrated circuits 59 are all operational amplifiers of type TL074. The capacitors 57 are 100 pF and the capacitors 58 are 0.001 $\mu$F.

Input voltages on 27 and 28 are converted into currents $I_1$ and $I_2$ by the voltage to current converters. These currents are applied to the matched pair transistors 56 whose base/emitter voltage is dependent on the log of the current. These base emitter voltages are subtracted by the final stage to yield the ratio. This method offers wide dynamic range, approximately 80 dB per channel or 160 dB in the quotient. Resistor tolerance and operational amplifier offsets are important in ensuring proper behaviour of the overall circuit.

Figure 5:
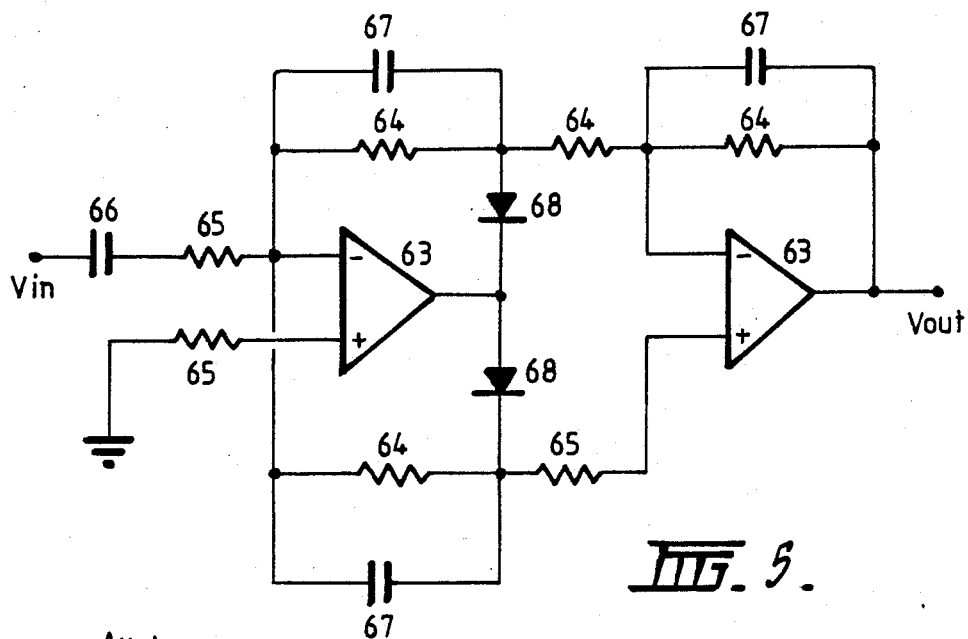
FIG. 5 is a detailed circuit diagram of a precision rectifier of FIG. 2.

Reference should now be made to FIG. 5 which shows the precision rectifier/filter circuit 39 in more detail. The circuit of the absolute value circuit 36 (FIG.

2) is very similar to the circuit for the precision rectifier/filter circuit 39 and only differs in component values due to the different gain requirement. The integrated circuits 63 in FIG. 5 are operational amplifiers of type 0P07 for low offset or type LF412 for economy. The resistors 64 are 10KΩ as are resistors 65. The capacitor 66 is 0.001 μF and the capacitors 67 are 1 nF. Diodes 68 are of type IN914. The characteristics of the circuit are represented by the following formula:

$$V_{OUT} = \sqrt{V_{IN}^2}$$

Figure 6:
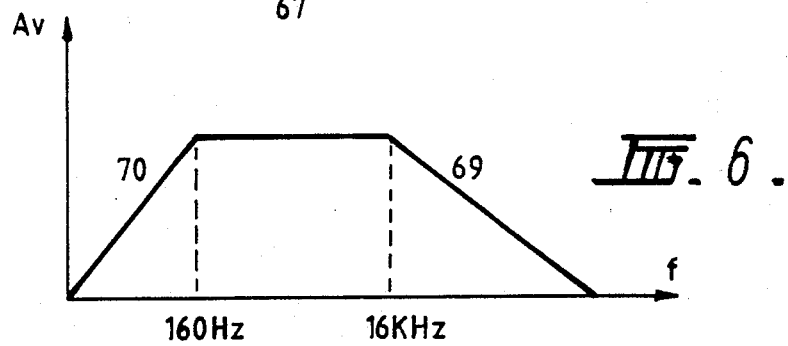
FIG. 6 is a graph showing the response of a precision rectifier of FIG. 5.

The filter response of the circuit of FIG. 5 is represented by the graph shown in FIG. 6 where the slope 70 is a slope of 6 dB per octave and the slope 69 is 12 dB per octave.

Figure 7:
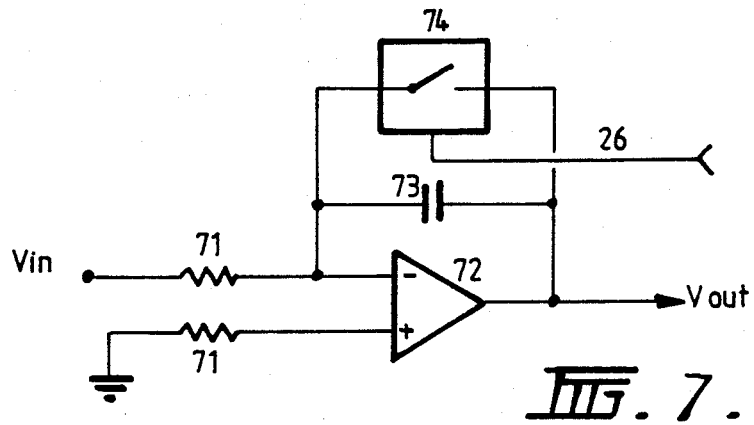
FIG. 7 is a more detailed circuit diagram of a gated integrator shown in FIG. 2.

Referring now to FIG. 7 which shows the integrator circuit 40 in more detail, it should be pointed out that this circuit is the same as the circuit used for the integrators 28 of the reference channel. The resistors 71 are 27KΩ resistors and the capacitor 73 is a 1 μF capacitor. The integrated circuit 72 is an amplifier type LF412 and the switch 74 is type CD4066. Connection 26 to the switch 74 is the clock connection shown in FIG. 2. The characteristics of the circuit are represented by the following formula:

$$V_{OUT} = \frac{-1}{0.027} \int_0^T V_{IN} dt$$

The requirements of the integrator circuits 28 and 40 are low leakage of the switch and low operational-amplifier offset.

Apart from electronic circuit imperfections, the overall effectiveness of the signal enhancement processor of this invention is dependent on the deviations from perfect representation of the corrupted signal by the sensing microphone 22. For perfect representation, this microphone must be identical and coincident with the actual receiver (the listener's ear). Since this is impossible, any system reliant on the sampling of the corrupted signal such as is the case here and with adaptive cancellation systems, suffers some degree of misrepresentation. This is of limited consequence in cases where this effect is static, since an initial calibration is sufficient to establish and implement sufficient corrective measures. Dynamic misrepresentation is more difficult to correct. It can arise from variations in the microphone coupling to the interference or to the desired signal. The former effect can be reduced by careful design and the use of multiple sensors and averaging or selecting the appropriate outputs. Fluctuations due to variable signal coupling can be compensated for by a dynamic control loop. A convenient calibration signal can be injected by addition to the enhanced desired signal. This signal can be rendered unobtrusive by making it sub-audible (by spread spectrum techniques for example). Since this signal is deterministic, it is not difficult to extract it by a matched filter from the filter picked up by sensing microphone 22, an amplified by 38, which should be converted to a voltage controlled amplifier just like 15 or 33. The gain control is derived from the magnitude of the output of the matched filter. The resultant loop functions just like a standard AGC maintaining the calibration signal output from 38 at a constant level, thus compensating for microphone signal coupling fluctuations.

Specific results of the enhancement of the signal to interference ratio at the listener's ear as a result of the invention include improved speech intelligibility and noise masking. Under normal conditions, the minimum ratio required for acceptable recognition is plus 7 dB, ranging up to plus 15 dB for hearing-impaired listeners. Thus an electromechanical source of human speech is intelligible within a zone for which the above criterion is satisfied. Without active source control, zone boundaries move in response to variable interference and speech content. Through its active source control, the signal enhancement processor acts to suppress these fluctuations, maintaining the zone boundary extended as far as possible within the limits of source power or distortion characteristics and tolerances thereof. Secondary sources such as those used in active noise cancellation can be controlled in a similar manner, to improve performance of the cancellation algorithm. The signal processor's effects diminish progressively with decreasing interference levels. In noise masking, the processor may help to attenuate the undesirable phsycho-acoustical effects of objectionable interference. Its application may be indicated by aesthetic or therapeutic reasons.

In summary, the automatic signal enhancement processor of this invention is an extremely simple cost effective high performance signal enhancement system. The circuitry used to construct all the building blocks may be analog or digital, off the shelf or custom designed, precision or economy. The last statement is a result of the tolerance of closed loop operation to individual component errors because of its inherent compensation and suppression abilities. Of course it will be readily apparent to persons skilled in the art that modifications can be effected to the above embodiment without departing from the spirit and scope of the invention. For example, improvements in the integrated circuit packages may enable simplification and improved performance. Thus, it is to be understood that the invention is not limited to the particular embodiment described, by way of example, hereinabove.

To assist in interpreting the present specification a glossary of some of the terms used hereinabove is set forth below.

GLOSSARY

Enhancement

In this context, enhancement is deemed to imply an improvement in such qualities which results in improved interpretation of the information conveyed by a signal.

Signal

The term signal is deemed to include any means of conveying information, for example, acoustical, optical, electrical, radio-frequency etc., or a stimulus applied to evoke a measurable response, provided that it is capable of unambiguous transformation into an electrical equivalent.

Desired

The term desired implies that the signal conveys the required message, or represents the required variable with perfect precision, free from any pre-existing distortions. In cases where a signal of suitable integrity is not available, standard techniques of recovering or extracting it from its perturbed or embedded state can be employed to render it suitable. It is assumed that the signal intercepted by the processor of the invention is the desirable signal.

Receiver

In this context, a receiver may be a person or device with no control over the intefering variable. The receiver may or may not have manual control over the source of the desired signal. Since the objective of the processor of the invention is to render this control automatic, the result is the liberation of the receiver from this burden, although the application of manual override is not precluded.

Interference

The term interference is construed to include any undesirable or competing signal incident on a receiver, thus corrupting the quality of the received signal. It can be natural or artificial, incidental or deliberate, static or dynamic, deterministic or stochastic. The interference may be in its unabated form, or the residual after available screening or suppression techniques have been implemented. The interference may be additive or multiplicative or complex in nature. It is assumed that the (unavoidable) degradation of the desired signal within the processor is less than that occurring externally.

Representative

In this context, a representative sample of the corrupted signal is one whose functional statistical average is closely related to its counterpart as measured by the intended receiver. An example might be the output of a sensing microphone, with similar characteristics to a human ear, placed where a listener might be.

I claim:

1. An adaptive gain control amplifier for converting an input signal to an analog controlled output signal in response to varying interference signals which mix with said output signal and result in a corrupted signal, said amplifier comprising:
   an amplifier stage for receiving said input signal and providing an output signal having a controlled output signal level;
   a prescaler circuit for receiving said output signal of said amplifier stage and comprising a secondary gain control amplifier for prescaling said output signal of said amplifier stage to provide a prescaled output signal;
   a time averaging circuit means, connected to said prescaler circuit, for providing a time averaged output signal of said prescaled output signal of said amplifier stage;
   a sensor means for detecting said corrupted signal and for providing a time averaged output signal of said corrupted signal;
   a divider circuit having a first input receiving said time averaged output signal of said prescaled output signal from said amplifier stage, a second input receiving said time averaged output signal of said corrupted signal, and an output provided to a control input of said amplifier stage, said divider circuit comprising means for providing a control signal at said output which is a ratio of said time averaged output signal of said corrupted signal and said time averaged output signal of said prescaled output signal from said amplifier stage to said control input of said amplifier stage; and
   wherein said prescaler circuit has a control input which receives a control signal which is proportional to said control signal at said output of said divider circuit.

2. An adaptive gain control amplifier as defined in claim 1, wherein said corrupted signal is an audio signal degraded by interference, said analog controlled output signal is the output signal of a loudspeaker and said sensor includes a microphone.

3. An adaptive gain control amplifier as defined in claim 2, further including a reference channel means for modifying an electrical signal representing said analog controlled output signal prior to application of said time averaged version of said prescaled signal to said divider circuit, said time averaging circuit means and said prescaler circuit forming part of said reference channel means and said prescaler circuit multiplying said electrical signal by said control signal for prescaling said electrical signal, said electrical signal constituting said output signal of said amplifier stage.

4. An adaptive gain control amplifier as defined in claim 3 wherein said reference channel further includes a gain stage and filter circuit to scale the magnitude of said electrical signal and limit the bandwidth thereof, and a precision rectifier/filter circuit to remove polarity dependence of said electrical signal, said gain stage and filter circuit and said rectifier/filter circuit being connected between said prescaler circuit and said time averaging circuit, and said time averaging circuit comprising an integrator circuit to time average said electrical signal.

5. An adaptive gain control amplifier as defined in claim 4, further including a sensing channel incorporating said sensor, said sensing channel further comprising a gain stage and filter circuit and an integrator circuit for modifying a further electrical signal prior to application to said divider circuit, said gain stage and filter circuit and said integrator circuit being connected between said microphone and said divider circuit and said further electrical signal being the output of said microphone which is modified in a similar manner to said electrical signal representing said controlled output signal.

6. A method of processing an input signal to produce a controlled output signal when said output signal has an interference signal mixed therewith to produce a corrupted signal at a receiver, said method comprising:
   sensing and processing said corrupted signal to produce a first control signal for controlling processing of said input signal to compensate for said interference signal, said processing of said corrupted signal comprising (a) producing a time-averaged version of said controlled output signal, (b) producing a time-averaged version of said corrupted signal, (c) computing a ratio of the modulus of said time averaged version of said corrupted signal and the modulus of said time averaged version of said controlled output signal to produce said first control signal, (d) employing said control signal to control an amplification stage of an adaptive gain control amplifier which produces said output signal, (e) providing a second control signal proportional to said first control signal, and (f) prescaling said controlled output signal in response to said second control signal prior to computing said ratio.

* * * * *